(12) United States Patent
Yampolsky et al.

(10) Patent No.: US 6,831,377 B2
(45) Date of Patent: Dec. 14, 2004

(54) REPETITIVE POWER PULSE GENERATOR WITH FAST RISING PULSE

(75) Inventors: Joseph Yampolsky, Torrance, CA (US); Martin A. Gundersen, San Gabriel, CA (US)

(73) Assignee: University of Southern California, Los Angeles, CA (US)

( * ) Notice: Subject to any disclaimer, the term of this patent is extended or adjusted under 35 U.S.C. 154(b) by 347 days.

(21) Appl. No.: 09/848,559

(22) Filed: May 3, 2001

(65) Prior Publication Data

US 2002/0140464 A1 Oct. 3, 2002

Related U.S. Application Data

(60) Provisional application No. 60/201,584, filed on May 3, 2000.

(51) Int. Cl.[7] .................................................. H03K 3/00
(52) U.S. Cl. ..................................................... 307/106
(58) Field of Search ................................. 307/106, 108

(56) References Cited

U.S. PATENT DOCUMENTS

| | | | | |
|---|---|---|---|---|
| 2,465,840 A | * | 3/1949 | Blumlein ...................... | 333/20 |
| 4,365,287 A | * | 12/1982 | Kettle et al. .................. | 363/94 |
| 4,763,093 A | * | 8/1988 | Cirkel et al. ................... | 336/58 |
| 4,818,892 A | * | 4/1989 | Oohashi et al. ............. | 307/106 |
| 5,023,768 A | * | 6/1991 | Collier .......................... | 363/68 |
| 5,412,254 A | * | 5/1995 | Robinson et al. ........... | 307/106 |
| 5,895,983 A | * | 4/1999 | Motomura ................... | 307/106 |
| 6,066,901 A | | 5/2000 | Burkhart et al. | |

OTHER PUBLICATIONS

Ridge et al., A Solid State Pulse Generator as a Grid Bias Supply for the Mitton, JF Allen Research Laboratories, BCC 1996, 4 pages.*

* cited by examiner

*Primary Examiner*—Gregory J. Toatley, Jr.
(74) *Attorney, Agent, or Firm*—Knobbe Martens Olson & Bear LLP

(57) ABSTRACT

A solid-state pulse generator using a split magnetic core transformer is described. In one embodiment, the solid-state drive circuit uses MOSFETs switching a blumlein to produce a desired input pulses in a primary winding of the split magnetic core. The pulse length is determined primarily by the characteristics of the blumlein and the split core transformer. The "on" time of the solid-state devices can exceed the output pulse length, thereby reducing the chance of damaging voltage spikes. The use of a split magnetic core allows several solid-state drive circuits to be used in parallel to produce a single output pulse. In one embodiment, each solid-state drive circuit drives a separate single-turn primary winding of a split magnetic core transformer. In one embodiment, each core of the split core transformer has one primary winding. The separate cores of the split core transformer are provided with a single secondary winding that couples all of the cores to produce a relatively high-voltage output pulse with relatively few turns in the secondary winding.

38 Claims, 20 Drawing Sheets

US 6,831,377 B2

REPETITIVE POWER PULSE GENERATOR WITH FAST RISING PULSE

REFERENCE TO RELATED APPLICATION

The present application claims priority benefit of U.S. Provisional Application No. 60/201,584, filed May 3, 2000, titled "REPETITIVE POWER PULSE GENERATOR WITH FAST RISING PULSE," the entire contents of which is hereby incorporated by reference.

This invention was made with the United States Government support under grant number NSFCTS9713275 awarded by the National Science Foundation and grant number DAAHO4-95-1-0413 awarded by Army Research.

BACKGROUND OF THE INVENTION

1. Field of the Invention

The invention relates to reliable solid-state pulse generators for generating repetitively short, high power pulses with relatively fast rise times.

2. Description of the Related Art

High voltage pulse generators, with relatively fast rise-times, are typically used to drive gas discharge loads such as lasers and discharge devices for pollution control applications. In the past, such pulse generators used thyratrons to generate the desired pulses. However, thyratrons are relatively unreliable, relatively heavy, and require complex electrical control systems. Solid state devices, although lighter and potentially more reliable than thyratrons, can switch less power on a per-device basis, Thus, a number of solid state devices are needed to replace a single thyratron. In some configurations where many solid-state devices are connected together, failure of one solid-state device can trigger the failure of many devices in the circuit. Moreover, solid state devices, although potentially more reliable than thyratrons, are relatively less tolerant of over-voltage and/or over-current transients. Solid state devices can be permanently damaged by a single over-voltage transient lasting only a few nanoseconds. In many pulse generators, the solid-state devices are used to drive an inductive load such as a transformer. Inductive loads are prone to generate voltage spikes when the current through the inductor is suddenly switched off (as typically occurs at the end of a pulse). These voltage spikes can destroy solid-state devices and render the pulse generator inoperable.

SUMMARY OF THE INVENTION

The present invention solves these and other problems by providing a solid-state drive circuit to drive a split magnetic core transformer. In one embodiment, the solid-state drive circuit uses MOSFETs to achieve desirable pulse characteristics. In one embodiment, the solid-state drive circuit uses a blumlein to produce a desired input pulses in a primary winding of the split magnetic core. In one embodiment, ferrite beads are used to further shape the pulse produced by the blumlein.

In one embodiment, the pulse length is determined not by the "on" time of a solid state device, but, rather, by the characteristics of the blumlein and the split core transformer. Since the solid-state devices do not determine the pulse length, the "on" time of the solid-state devices can exceed the pulse length. When the solid-state devices are finally turned off, no damaging voltage spike is generated because the current through the inductors (e.g., the current through the transformer) is negligible. This protects the solid-state devices from harmful voltage spikes and simplifies the drive circuits for the solid-state devices (since the solid-state device can be driven by a relatively long pulse).

The use of a split magnetic core allows several solid-state drive circuits to be used in parallel to produce a single output pulse. In one embodiment, the split magnetic core is configured as an inductive adder. The split magnetic core combines the output from several solid-state drive circuits in a manner that leaves the drive circuits relatively isolated from one another. This relative isolation reduces the chance that a failure in one solid-state drive circuit will cause failures in other solid state drive circuits.

In one embodiment, each solid-state drive circuit drives a separate primary winding of a split magnetic core transformer. In one embodiment, the primary windings are low-impedance single-turn windings. In one embodiment, each core of the split core transformer has one primary winding. In one embodiment, the separate cores of the split core transformer are provided with a single secondary winding that couples all of the cores. In one embodiment, the secondary winding is a multi-turn winding. In one embodiment, the number of turns in the secondary winding is selected to match the output impedance of the transformer to the impedance of the load, thereby providing increased power to the load.

In one embodiment, the solid-state drive circuits and the split magnetic core are constructed on a modular basis such that any one (or any pair) of the solid-state drive circuits can be easily replaced without disassembling the split magnetic core.

As compared to a thyratron, the solid-state pulsed power generator provides a relatively higher repetition rate, improved lifetime, reduced weight, simplified electrical control system, and reduced electrical power requirements.

In one embodiment, the pulse power generator is used to produce pulsed electrical fields for medical and biomedical applications. In one embodiment, the pulse power generator is used to produce pulsed electrical fields for plasma exhaust treatment systems for automobiles and other vehicles.

BRIEF DESCRIPTION OF THE DRAWINGS

The advantages and features of the disclosed invention will readily be appreciated by persons skilled in the art from the following detailed description when read in conjunction with the drawings listed below.

Figure 1:
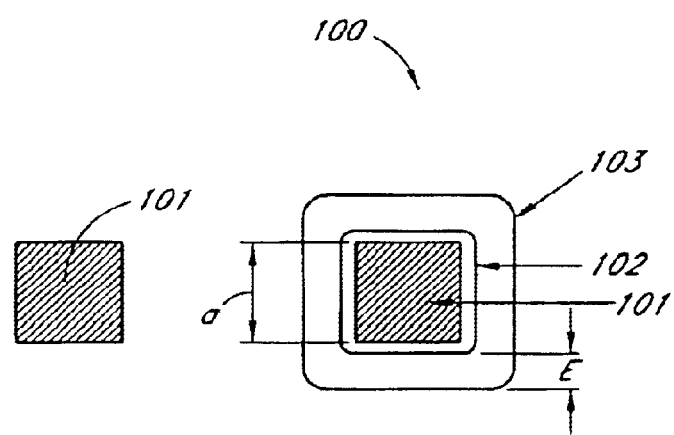
FIG. 1 illustrates a magnetic core with a primary winding and a secondary winding.

In the drawings, the first digit of any three-digit number generally indicates the number of the figure in which the element first appears. Where four-digit reference numbers are used, the first two digits indicate the figure number.

DETAILED DESCRIPTION

FIG. 1 shows a transformer 100 having a magnetic core 101 with a primary winding 102 and a secondary winding 103. For the transformer 100, the pulse rise time in the secondary (i.e., after transformation) is given by the equation:

$$T_{rts} = T_{rtp} + 2\nu L \qquad (1)$$

where $T_{rts}$ is the rise time of the pulse at the secondary winding, $T_{rtp}$ is the rise time of the pulse at the primary winding, $\mu$ is the velocity of light in the insulation material ($\mu \approx 5$ m/ns), and L is the length of the wire in the secondary winding (in meters). Equation (1) is proper when the impedance of the transformer is approximately matched to the impedance of the load. The transformer impedance $Z_{st}$ is given by:

$$Z_{st} = \sqrt{\frac{L_{st}}{C_{st}}}$$

where $L_{st}$ is a stray inductance of the transformer secondary winding and $C_{st}$ is the stray capacitance of the secondary winding. If the transformer is not matched to the load, the length of the core can be changed. The capacitance is proportional to the length of the core and the inductance is inversely proportional to the length of the core.

The width of the "flat top" portion of a pulse on the secondary winding of the transformer 100 is given by:

$$T_{rts} = \frac{W_2 D_b S}{U_s} \qquad (2)$$

where $W_2$ is the number of turns in the secondary winding. S is the core area, and $D_b$ is the change of magnetic field in the core (in Wb/m$^2$). Combining Equations (1) and (2) and assuming that: the cross-section of the core is square; the high voltage winding is located above the low voltage winding; the insulation of the low voltage in winding is negligible; and the maximum electrical field is defined by $E_{max}$ in (V/m) then:

$$\frac{T_{rts}}{T_{fts}} = \frac{2\nu U}{D_b S}\left(4\sqrt{S} + \frac{\pi U}{E_{max}}\right) \qquad (3)$$

The cross section of the core depends primarily on $T_{rt}/T_{ft}$ and on the applied voltage. The actual length of the pulse depends primarily on the number of turns in the secondary. For a given $T_{rt}/T_{ft}$, the cross-section of the core rises dramatically with the applied voltage (when the voltage rises 10 times the cross-section of the core rises 200 times). Only a relatively small coefficient of transformation can provide high voltage with a good pulse shape.

Figure 2:
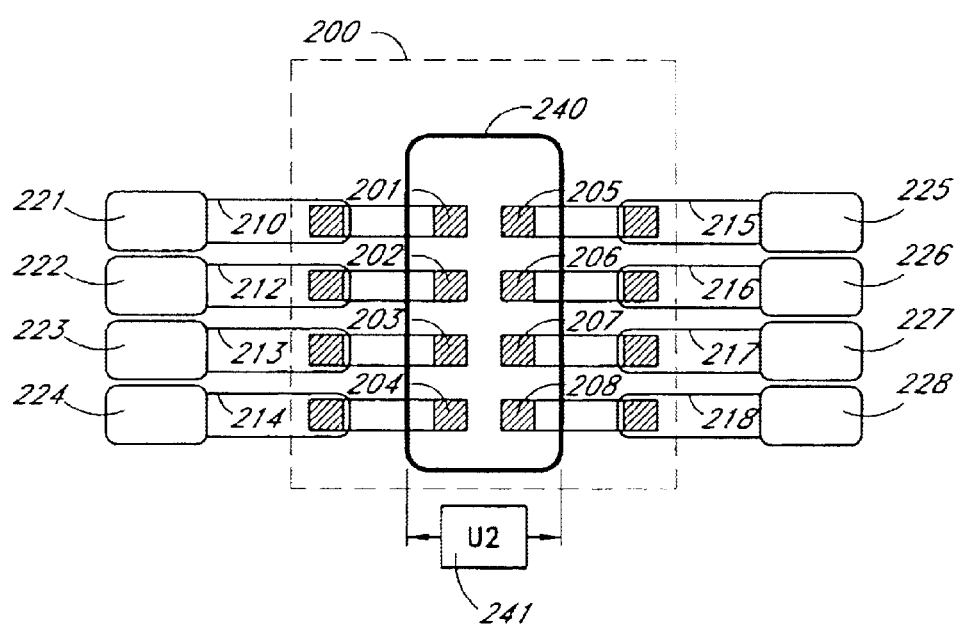
FIG. 2 shows a split core transformer in a racetrack configuration.
Figure 3:
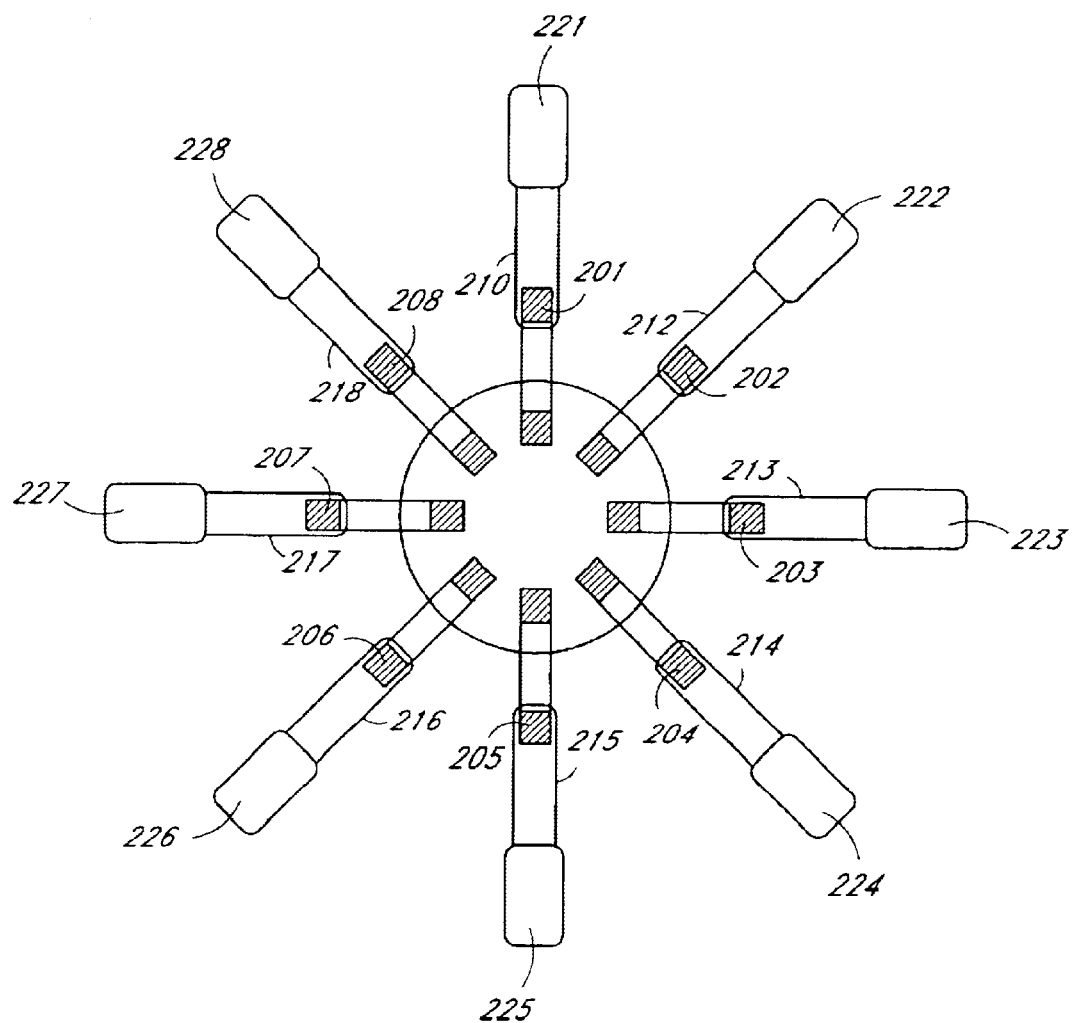
FIG. 3 shows a split core transformer in a circular configuration.

In one embodiment, a well-formed 50 kV pulse using small voltage switches (e.g. MOSFET transistors) with blocking voltage of 500–1000V is desired. With a single core in the transformer, a 50 kV output pulse would require an input pulse (in the primary) of approximately 10 kV. This voltage is too high for many solid state devices. The required primary voltage can be reduced by using a split-core transformer, as shown in FIGS. 2 and 3. FIG. 2 shows a split core transformer 200 in a racetrack configuration. FIG. 3 shows the split core transformer 200 in a circular configuration. The transformer 200 includes eight cores 201–208. In one embodiment, the cores 201–208 are toroidal cores made of ferrite, iron, or other magnetic material. Each of the cores 201–208 has a primary winding 210–218 respectively. In one embodiment, the primary windings are single-turn windings. Each of the primary windings 210–218 is driven by a separate drive module 221–228 respectively. All of the cores 201–208 are linked by a single secondary winding 240. In one embodiment, the secondary winding 240 is a multi-turn winding. The secondary winding is provided to a load 241.

In FIG. 2, the cores 201–208 are arranged in a racetrack configuration with four cores on each side, such that the secondary winding approximates the shape of an oval racetrack. In FIG. 3, the cores 201–208 are arranged in a circular fashion such that the secondary winding is approximately circular.

In the split core transformer 200, the total magnetic core cross-section (given by Equation (3)) is made of several smaller cores (the cores 201–208). For example, in order to get the output voltage 50 KV with a pulse length of 100 ns, only 14 ferrite cores (having a cross section of 0.5 in×0.5 in) are needed. In this case, a wire for the secondary winding will be 70" which will be short enough to provide a rise time of 20 ns.

In a conventional solid-state pulse driver that uses MOSFET switches, the gate of each MOSFET is driven by a high current integrated circuit op-amp (typically one op-amp per MOSFET). Each integrated circuit needs a low voltage power line and a synchronization pulse from a distribution system.

Figure 4:
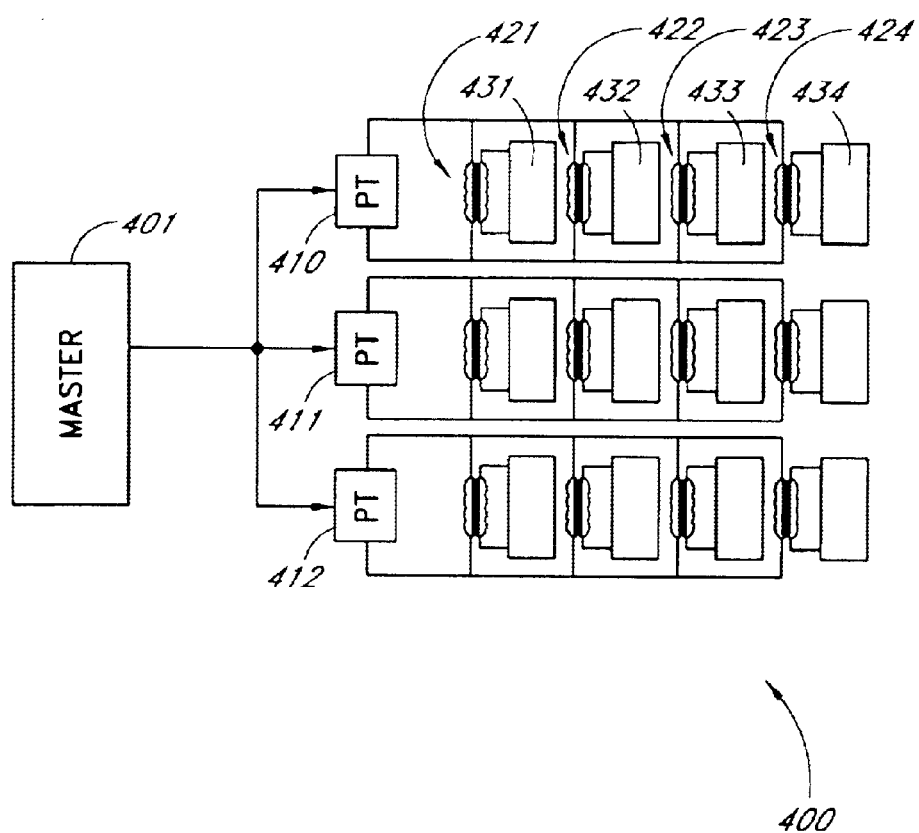
FIG. 4 illustrates driving multiple low-inductance pulse transformers.

FIG. 4 shows an advanced drive system 400 wherein the troublesome op-amps are eliminated. In the drive system 400, a master pulse generator 401 provides a trigger pulse to one or more pulse drivers 410–412. The pulse driver 410 drives a primary winding of low-inductance pulse transformers 421–424. A secondary winding of each of the pulse transformers 421–424 drives a MOSFET based drive circuit 431–434 respectively. The pulse drivers 411 and 412 are similarly configured to drive pulse transformers that, in turn, drive MOSFETs.

Figure 11:
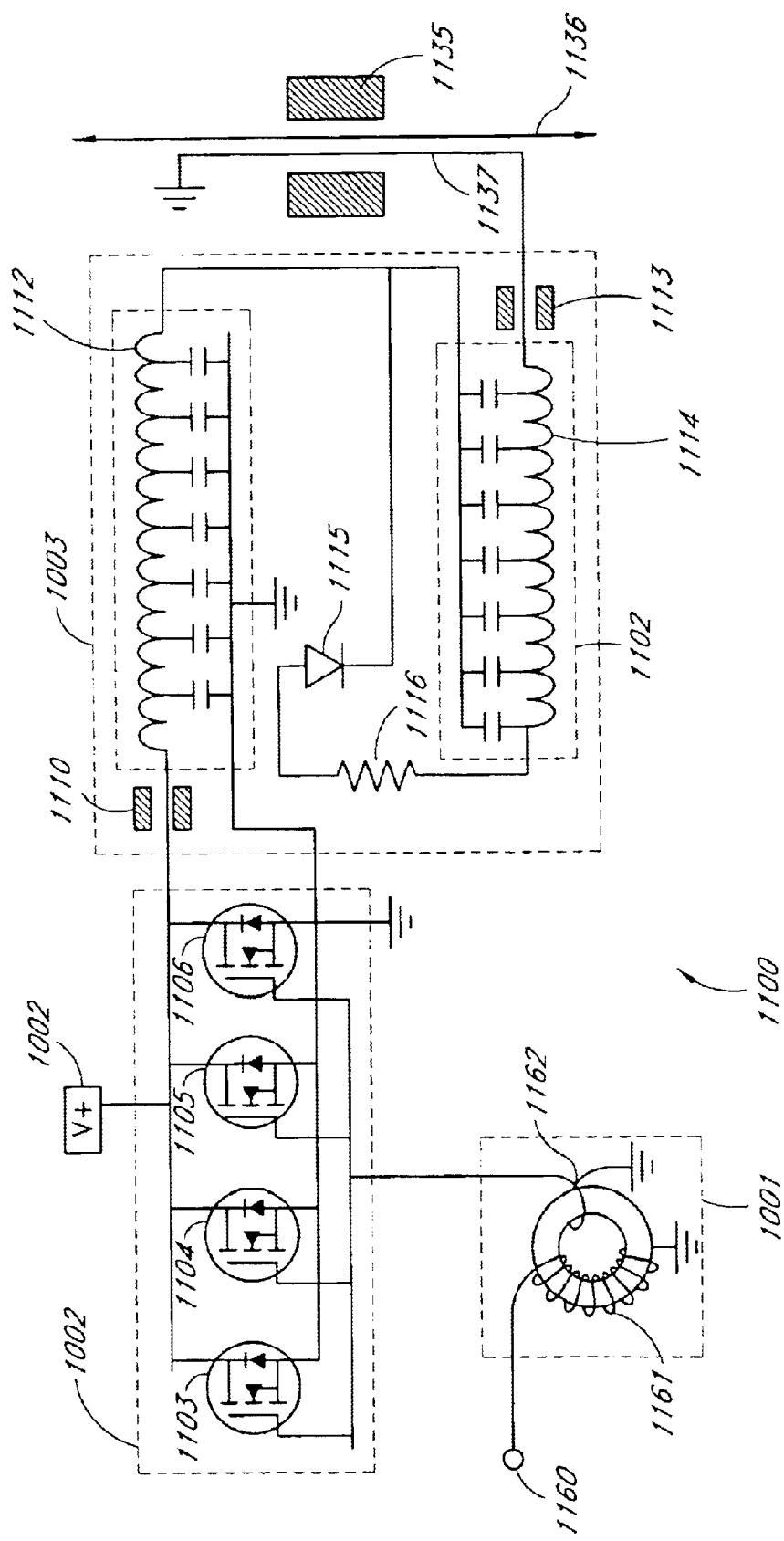
FIG. 11 is a schematic of a core driver.
Figure 19:
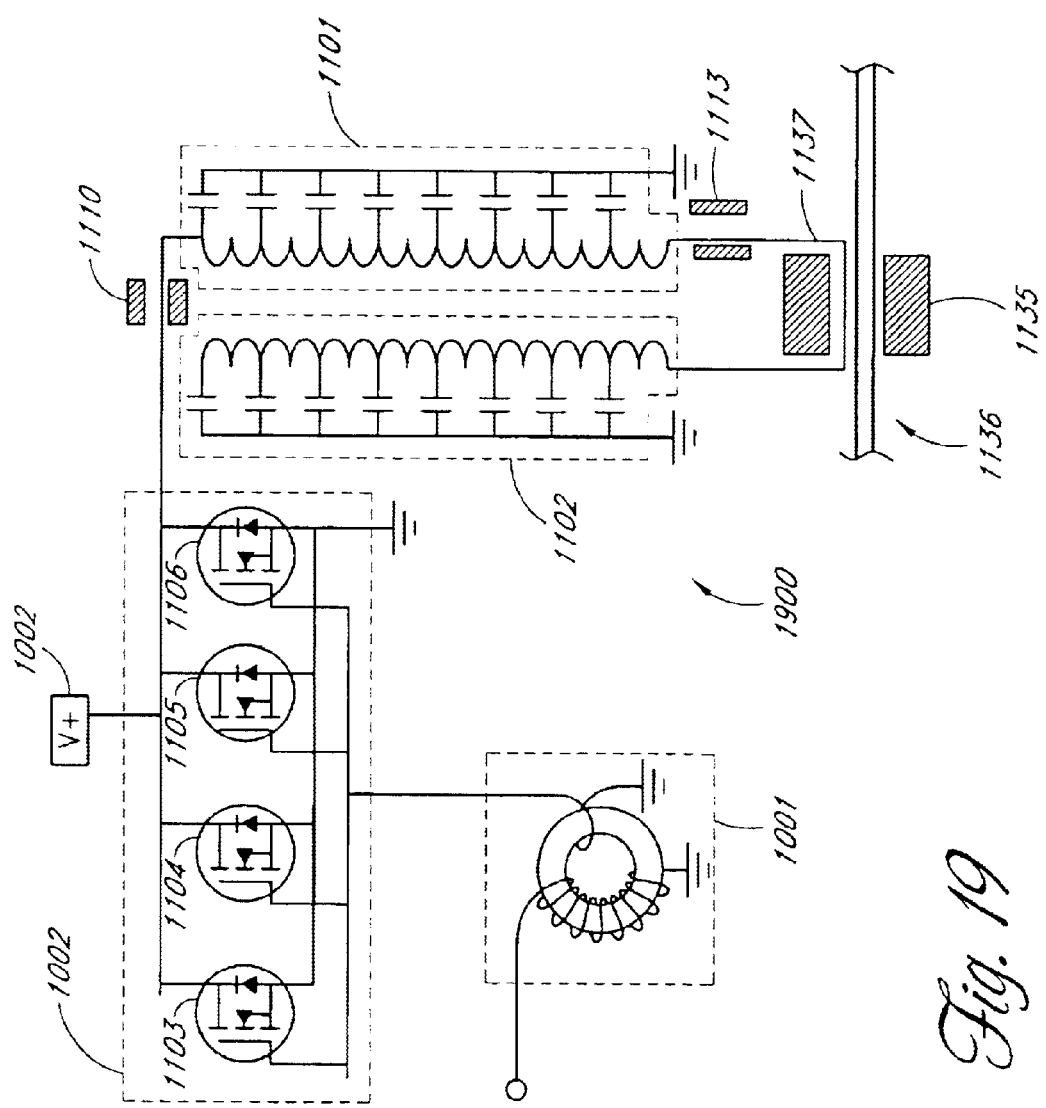
FIG. 19 is a circuit schematic of an alternate embodiment of the core driver.

In one embodiment, the pulse drivers 410–412 generate a drive pulse (for driving the low-inductance transformers) using a blumlein in a manner similar that shown in the core driver circuits of FIGS. 11 and 19. In one embodiment, the blumlein used in the pulse drivers 410–412 is configured to generate a pulse more than twice as long as the pulse generated by the blumleins in FIGS. 11 and 19.

The low inductance transformers 421–424 allow the op-amps to be eliminated since the MOSFETs can be driven directly by the transformers 421–424. Eliminating the op-amps allows the gate current for each MOSFET to be increased from 6 A to 20 A, thus providing improved pulse rise times. In addition, the circuit is simpler, and less costly.

In MOSFET transistors, the conductivity is determined by the main carriers. The absence of diffusion allows each transistor to turn on in a few nanoseconds. However, the gate has a relatively large capacitance. Fast turn-on times require the delivery of enough charge to the gates to quickly charge the gate capacitance. For example, in order to get from the "off" state to a low conductivity on sate of 0.1 ohm for the transistor, the gate of a APT5010LVR transistor needs a charge of 312 nC (nano-Coulombs).

This means that a minimum current of 15 A must be delivered to the gate to provide a rise time of 20 ns. The commercially available driver MAX2044 can provide a maximum current of 6 A, which is not enough current to provide a 20 ns rise time. The gate current problem is even more difficult when it is necessary to drive several tens or hundreds of transistors. This can be accomplished by using the power transistor with a system of transformers to boost the current. For example, the gate of one transistor needs about 15 V with 15 A, about 225 w of pulsed power. A power transistor such as the APT5010LVR can produce a power of 12.5 KW when working as a switch into a single forming line. In order to produce a good output pulse with a low driving current (e.g., 6 A), it is necessary to reduce the output power of the APT5010LVR to 5.4 kw with a switch voltage of 500 v and a current of 22 A. This power is enough for 24 gates. Assume the impedance of the forming line is $R=U_{sw}/I_{sw}/2=11.3$ ohms. Then the coefficient of transformation is 16 and the output impedance of the transformer is $11.3/16^2=0.043$ ohms. To have a rise time of about 20 ns, the stray inductance of this transformer must be 0.8 nh. This is relatively low inductance. Such a low inductance can be produced by using several transformers, as shown in FIG. 4.

Figure 5:
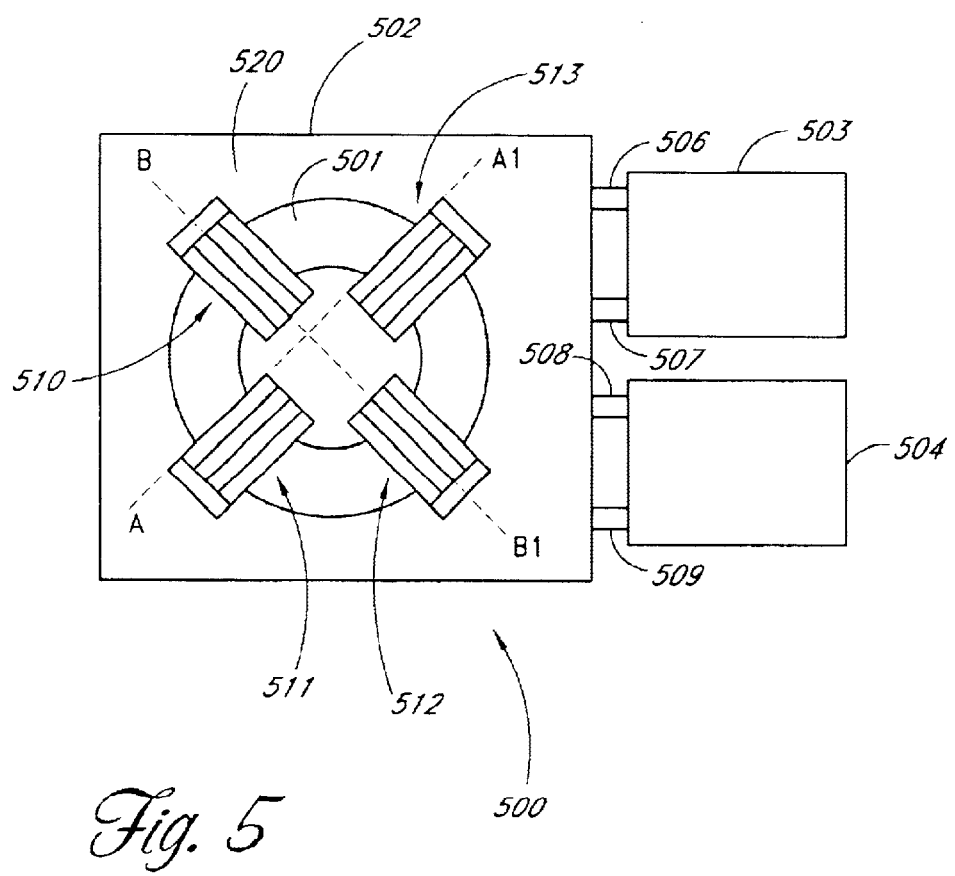
FIG. 5 is a top view of one embodiment of a pulse driver transformer.
Figure 6:
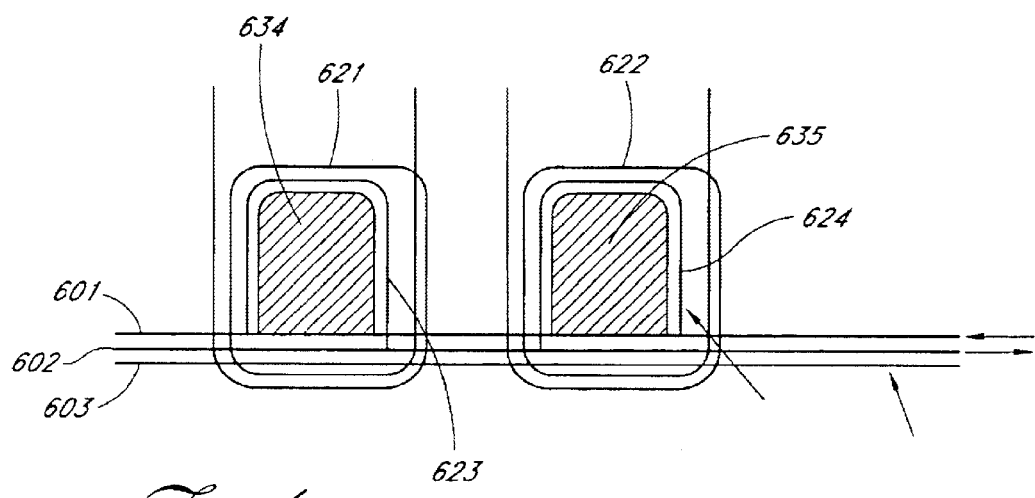
FIG. 6 is a side view of the pulse driver transformer from FIG. 5 showing connections of a first pair of primary windings.
Figure 7:
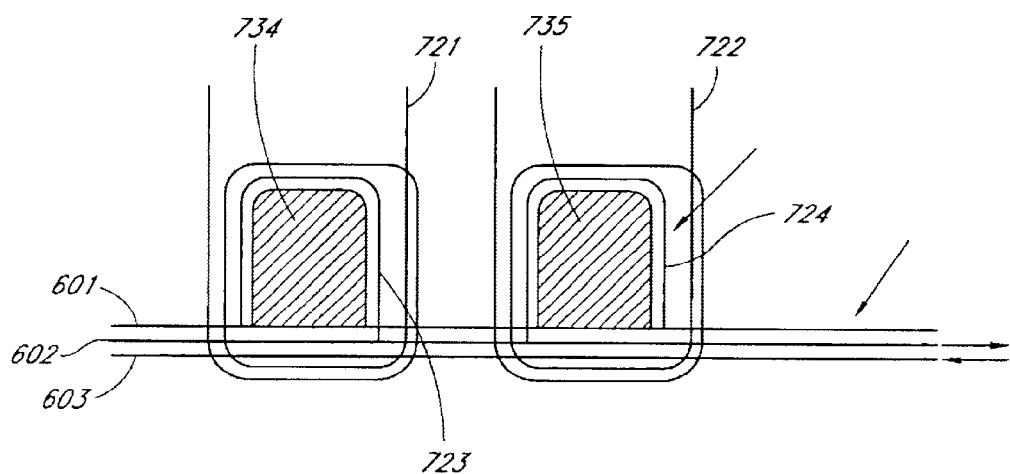
FIG. 7 is a side view of the pulse driver transformer from FIG. 5 showing connections of a second pair of primary windings.

One embodiment of the low-impedance transformers 421–424 is shown in FIGS. 5–7. FIG. 5 shows a top view of a low-inductance pulse transformer 500 assembly. The low-inductance transformer assembly 500 includes a magnetic core 501, circuit board layers 520 operating as a 3-wire transmission line (as shown in FIGS. 6 and 7), four or more sections of primary winding, and four or more sections of the secondary winding. The windings are shown as windings 510–513. In one embodiment, the secondary windings are single-turn windings made from a copper strips working in parallel. The coefficient of transformation is numerically equal to the number of turns in the primary winding (for the single-turn secondary). The windings are equally spread between the sections. The primary winding is made using insulated wire and is wound on the surface of the copper strips that make up the secondary winding. In one embodiment, the secondary turns are wound through holes in the circuit board 520.

FIG. 6 how shows a first half of the secondary winding (corresponding to the cross section A–A1) is connected between the middle and upper plate of a 3-conductor transmission line in the circuit board 520. The 3-conductor transmission line is made from circuit board conducting layers 601–603. The conducting layers are separated from each other by dielectric circuit board layers. In FIG. 6, the core 501 is shown as a left-hand portion 634 and a right-hand portion 635. Primary windings 621, and 622 wrap the core portions 634 and 635 respectively. Secondary windings 623, and 624 wrap the core portions 634 and 635 respectively. The secondary winding 623 is provided to layers 601 and 602. The secondary winding 624 is provided to layers 601 and 602. The secondary windings 623 and 624 are wound opposite-sense so that their output currents will be in phase.

FIG. 7 how shows a second half of the secondary winding (corresponding to the cross section B–B1) is connected to the conductors 601–603. In FIG. 7, the core 501 is shown as a left-hand portion 734 and a right-hand portion 735. Primary windings 721, and 722 wrap the core portions 734 and 735 respectively. Secondary windings 723, and 724 wrap the core portions 734 and 735 respectively. The secondary winding 723 is provided to layers 602 and 603. The secondary winding 724 is provided to layers 602 and 603. The secondary windings 723 and 724 are wound opposite-sense so that their output currents will be in phase.

Constructing the low-inductance transformer as shown in FIGS. 5–7 produces a low impedance circuit. The low impedance properties result from the use of a single-turn secondary and the low-impedance 3-contuctor transmission line output connections. The 3-conductor transmission line is provided to the driver transistors as shown in FIG. 8.

Figure 8:
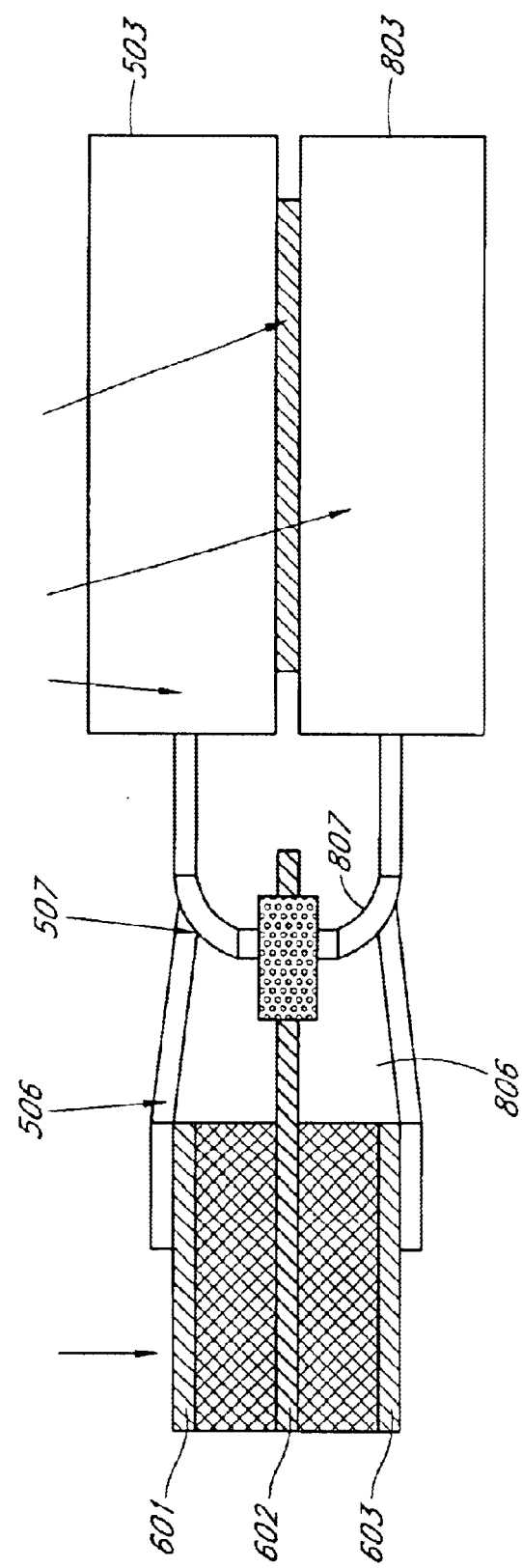
FIG. 8 is a side view of the pulse driver transformer from FIG. 5 showing connections to a pair of power MOSFETs.

FIG. 8 is a side view of the assembly 500 showing the transistor 503 and a transistor 803. A first terminal (either a gate or a source) of the transistor 503 is provided to the conductor 601, and a second terminal (either the source or the gate) of the transistor 503 is provided to the conductor 602. Connecting the gate and source of the transistor 503 to the conductors 601, 602 allows the first secondary winding of the low-impedance transformer to turn the transistor 503 on and off. Similarly, a first terminal (either a gate or a source) of the transistor 803 is provided to the conductor 602, and a second terminal (either the source or the gate) of the transistor 803 is provided to the conductor 603. Connecting the gate and source of the transistor 803 to the conductors 602, 603 allows the second secondary winding of the low-impedance transformer to turn the transistor 803 on and off.

Figure 9:
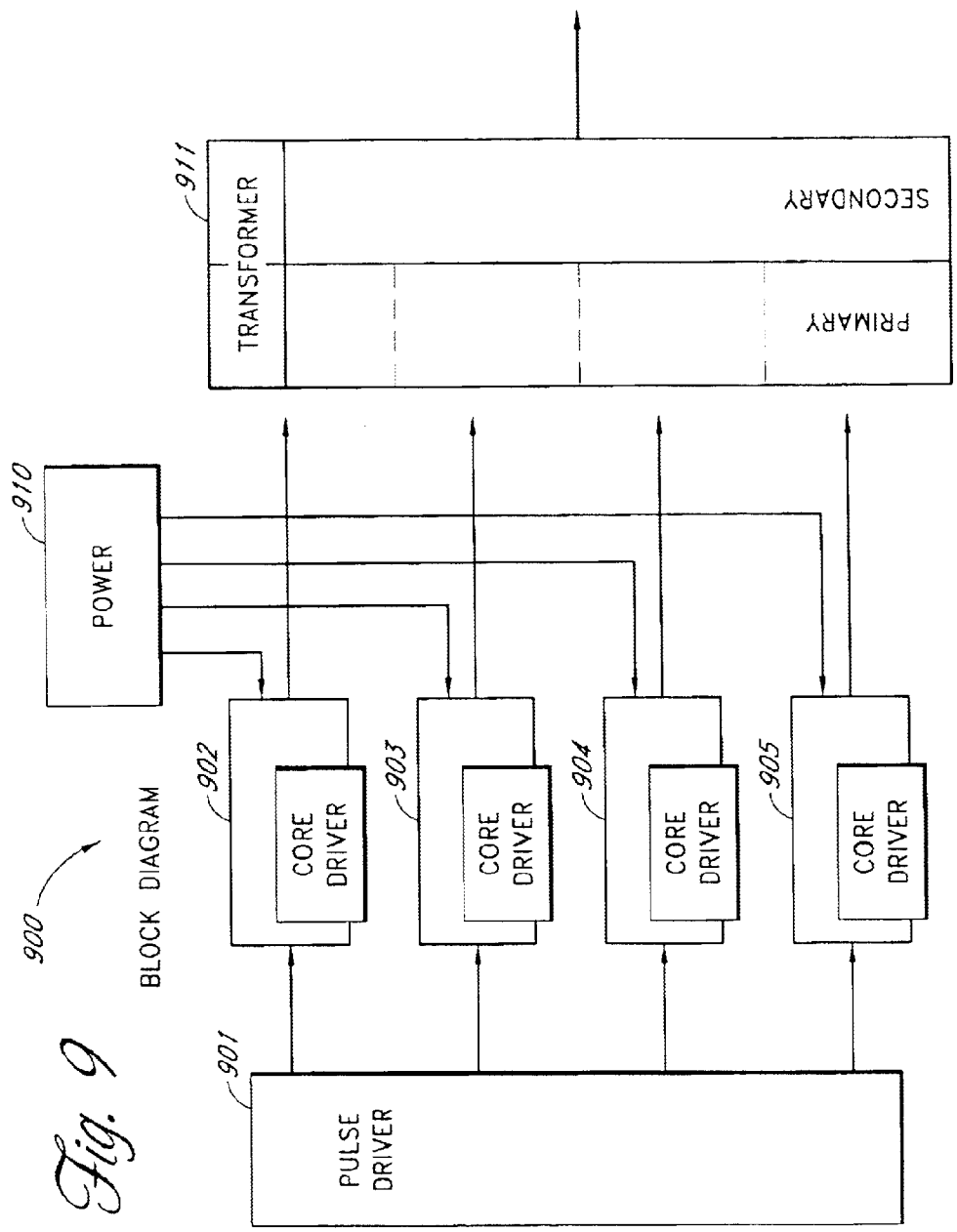
FIG. 9 is a block diagram of a pulse generator where one or more core drivers drive windings of a split core transformer.

FIG. 9 shows a block diagram of a pulse generator system 900 using a split core transformer 911. In the system 900, a pulse driver 901 provides drive pulses to driver inputs of core drivers 902–905. A power supply 910 is provided to a power supply input of the core drivers 902–905. Each of the core drivers 902–905 drives one or more primary windings of the split-core transformer 911. In one embodiment, each of the core drivers 902–905 drives a single primary winding, and each core of the split-core transformer has a single primary winding. In one embodiment, the primary windings are single-turn windings.

Figure 10:
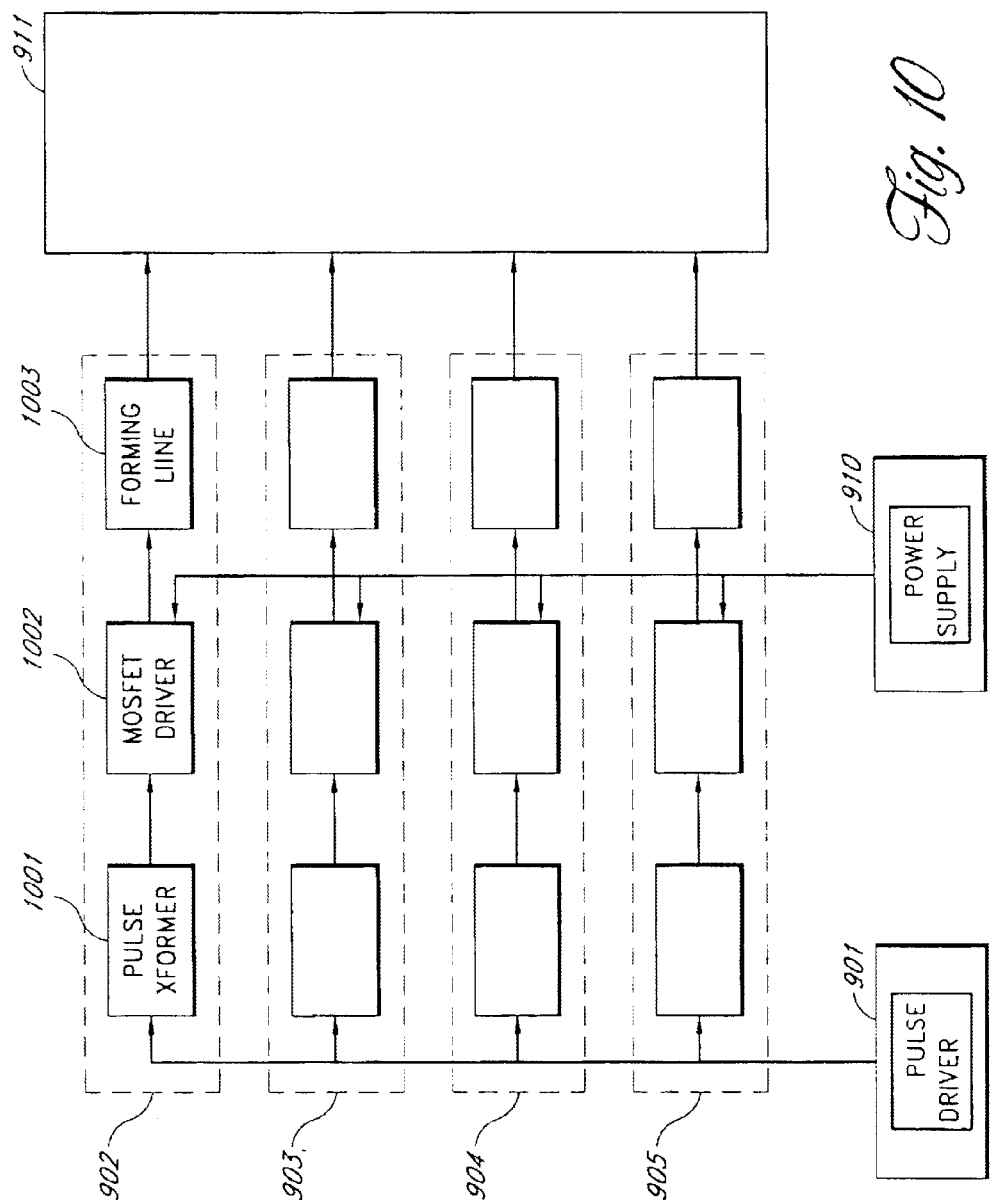
FIG. 10 is a block diagram of the core drivers shown in FIG. 9.

FIG. 10 is a block diagram of the core drivers 902–905. For example, in the core driver 902, the input pulse from the pulse driver 901 is provided to a pulse transformer 1001. An output from the pulse transformer 1001 is provided to a control input of a solid-state driver circuit 1002. The power supply 910 is provided to a power supply input of the solid-state diver 1002. An output of the solid-state driver 1002 is provided to an input of a pulse forming line 1003. An output of the pulse forming line 1003 is provided to a primary of the transformer 911. In one embodiment, the forming line 1003 uses one or more lumped-element transmission lines configured as a blumlein to form a desired pulse. The core drivers 903–905 are similar in construction to the driver 902.

The core driver 902 generates a pulse by using the solid state driver 1002 to switch the forming lines 1003. For this type of generator, the output power is given by equation $$P_{out} = U_{sw} * I_{sw}/2 \qquad (4)$$

where $U_{sw}$ is a blocking voltage of the solid-state driver 1002 and $I_{sw}$ is a current of the solid-state driver 1002.

In an alternate embodiment, the solid-state driver 1002 can be used to control the partial discharge of a capacitor (without forming lines). This method needs a fully controllable switch and the output power is given by the formula $P_{out} = U_{sw} * I_{sw}$. Thus, for a given power, the partial-discharge circuit need half the number of the switches that the forming-line circuit needs.

Nevertheless, the forming-line core driver 902 has several distinct advantages not recognized in the prior art. For example, when driving gas discharge load, the load is extremely unstable and can change from a short circuit to an open circuit during the discharge. Unstable loads place special requirements on the pulse generator, and the forming-line based core driver 902 is able to meet these requirements. The forming-line core driver 902 generally provides some measure of independence between the switch current and the load resistance (except possibly during times of oscillation). The forming-line core driver 902 reduces the amount of energy in the generator. This reduces the probability of damages and the cost of storage capacitors. In the forming-line core driver 902, the charging voltage of the lines starts from zero (because most of the stored energy is dissipated during each pulse). This allows the use of a resonant charging system. In one embodiment, a voltage doubler can be used to increase the wall voltage from 115v AC to 650v DC without any transformer in the main power supply.

Further, in the forming-line core driver 902, the protection system is very simple. The gates of transistors are held in the in "on" position until most of the stored energy is dissipated or until oscillations occur. The absence of large storage capacitors reduces the size and cost of the core driver 902, allowing it to be assembled as a relatively thin, easily replaceable, circuit board. Taken together, the above advantages mean that by using the forming-line based core drivers 902–905, the whole generator 900 can be made more compact, feasible and reliable.

FIG. 11 is a circuit schematic showing a core driver 1100. The core driver 1100 is one possible embodiment of the core driver 902. In the core driver 1100, a pulse input 1160 is provided to a first terminal of a primary winding 1161 of the pulse transformer 1001. The second terminal of the primary winding 1161 is provided to ground. A first terminal of a secondary winding 1162 of the pulse transformer 1001 is provided to gate inputs of MOSFETs 1103–1106. A second terminal of the secondary winding 1162 is provided to ground. A V+ output of the power supply 910 is provided to the drains of the MOSFETs 1103–1106. The drains of the MOSFETs 1103–1106 are also provided, through an inductor 1110 to a first inductor terminal of a lumped-element transmission line 1101.

The lumped-element transmission line is a three-terminal device having two inductor terminals and a common capacitor terminal. In the Lumped-element transmission line, an inductor 1112 is disposed between the two inductor terminals. The Lumped-element transmission line also includes a plurality of capacitors, each capacitor having a first terminal and a second terminal. The first terminals of the capacitors are provided to the inductor at points distributed along the length of the inductor 1112. The second terminal of each of the capacitors is provided to the common capacitor terminal of the lumped-element transmission line. A lumped-element transmission line 1102 is similar in topology to the lumped-element transmission line 1101. The lumped element transmission lines 1101 and 1102 are configured as a blumlein.

The sources of the MOSFETs 1103–1106 are provided to ground and to the common capacitor terminal of the lumped-element transmission line 1101. A second inductor terminal of the lumped-element transmission line 1101 is provided to a common capacitor terminal of the second lumped-element transmission line 1102. A first inductor terminal of the lumped-element transmission line 1102 is provided to a first terminal of a primary winding 1137. The winding 1137 is a single-turn winding on a core 1135 of the split-core transformer 911. A second terminal of the winding 1137 is provided to ground. A secondary winding 1136 (single or multiple turns) passes through the core 1135.

In one embodiment, an optional snubber circuit is included. The snubber circuit includes a resistor 1116 and a diode 1115. A first terminal of the resistor 1116 is provided to a second inductor terminal of the lumped-element transmission line 1114, and a second terminal of the resistor 1116 is provided to an anode of the diode 1115. A cathode of the diode 1115 is provided to the common capacitor terminal of the lumped-element transmission line 1114.

In one embodiment, the inductors 1110 and 1113 are ferrite beads. In one embodiment the MOSFETs 1103–1106 are APT5010LVR types. The first line of the lumped-element transmission line 1112 has six cells (six capacitors) an impedance $(Z=\sqrt{L/C})$ of 1.77 ohms, and a time delay of 50 ns. The second line of the lumped-element transmission line 1114 has six cells, an impedance of 1.77 ohms, and a time delay of 50 ns.

The ferrite beads 1110 and 1113 sharpening the generator pulse by inhibiting the pulse until sufficient current has been generated to saturate the ferrite core of the magnetic beads. Once the ferrite beads saturate, they no longer tend to inhibit the current. Thus, to some extent, the ferrite beads 1110 and 1113 tend to sharpen the pulse in a manner similar to an avalanche device. The optional snubber circuit serves to dampen oscillations in the primary circuit.

Safe operating area protection of the MOSFETs 1103–1106 is based on the following considerations. First, each MOSFET is protected from excessive current. For an APT5010LVR, the maximum value of pulsed current is 188 A. In the circuit 1100, the pulsed value of the current is only 75 A because the higher current is not acceptable from the point of view of the pulse rise time. If a short circuit occurs across the secondary 1136, the MOSFETs 1103–1106 will not see the short because of the characteristics of the impedance of the lumped-element transmission lines 1101 and 1102. When the MOSFETs 1103–1106 turn on, they short the voltage source 910 to ground. The internal impedance of the source 910 should be sufficient to limit the short circuit current of the source 910 to an acceptable level. In one embodiment, the source 910 is a voltage doubler (or tripler) tied directly to the 110 volt AC power lines. The internal impedance of the voltage doubler is sufficient to limit the current of the source 910 to safe operating levels, while still providing sufficient current to charge the capacitors in the lumped-element transmission lines 1101 and 1102. Additional over-current protection is typically not needed.

Each transistor 1103–1106 must also be protected against over-voltage conditions. The specified maximum drain to source voltage for the APT5010LVR is specified as 500 volts. The real over-voltage danger in a pulse generator typically occurs when the transistors switch off. If the primary winding 1137 is carrying current, and that current is rapidly switched off, the inductance of the transformer 911 will cause a voltage spike. This voltage spike often damages the switching transistors. However, in the circuit 1100, the lumped-element transmission lines 1101 and 1102 create a shaped driving pulse for the primary 1137. The transistors 1103–1106 can be switched off after the pulse has ended and the primary 1137 is no longer carrying any significant current. Thus, the possibility of producing a large voltage spike is largely eliminated.

In theory, it is a simple matter to switch off the gates of the transistors 1103–1106 after the pulse of current is over. The problem arises when the impedance of the transformer 911 does not match the impedance of the load presented to the secondary 1136. If an impedance mismatch occurs, then oscillations can occur. These oscillations can be as long as several microseconds. When the load is a short circuit, the snubber circuit dampens these oscillations. When the load is open, the train of unipolar pulses produced in the transformer 911 will drive the magnetic core of the output transformer into saturation and make the load appear as if it were a short circuit. If the generator is matched to the load, only positive voltage will be on the line between the two lumped-element transmission lines and the diode 1115 will be reverse biased at all times.

The current in the resistor 1116 can be measured and these measurements can be used to determine how well the generator is matched to the load. If the current in resistor 116 is zero, the generator is well matched to the load. If the current in the resistor 1116 is $I=U_{ch}/R_p$, where $R_p$ is the resistance of the resistor 1116, then the generator delivers no power to the load. The value of the resistor 1116 is typically chosen to be close to the impedance of the lumped-element transmission line 1102.

As stated earlier, the lumped-element transmission lines 1101 and 1102 are configured as a blumlein. The blumline acts as a transient voltage doubler such that the pulse produced in the primary 1137 has approximately twice the voltage of the voltage source 910. One skilled in the art will recognize that the lumped-element transmission lines 1101 and 1102 can be replaced with other types of transmission lines.

Figure 12A:
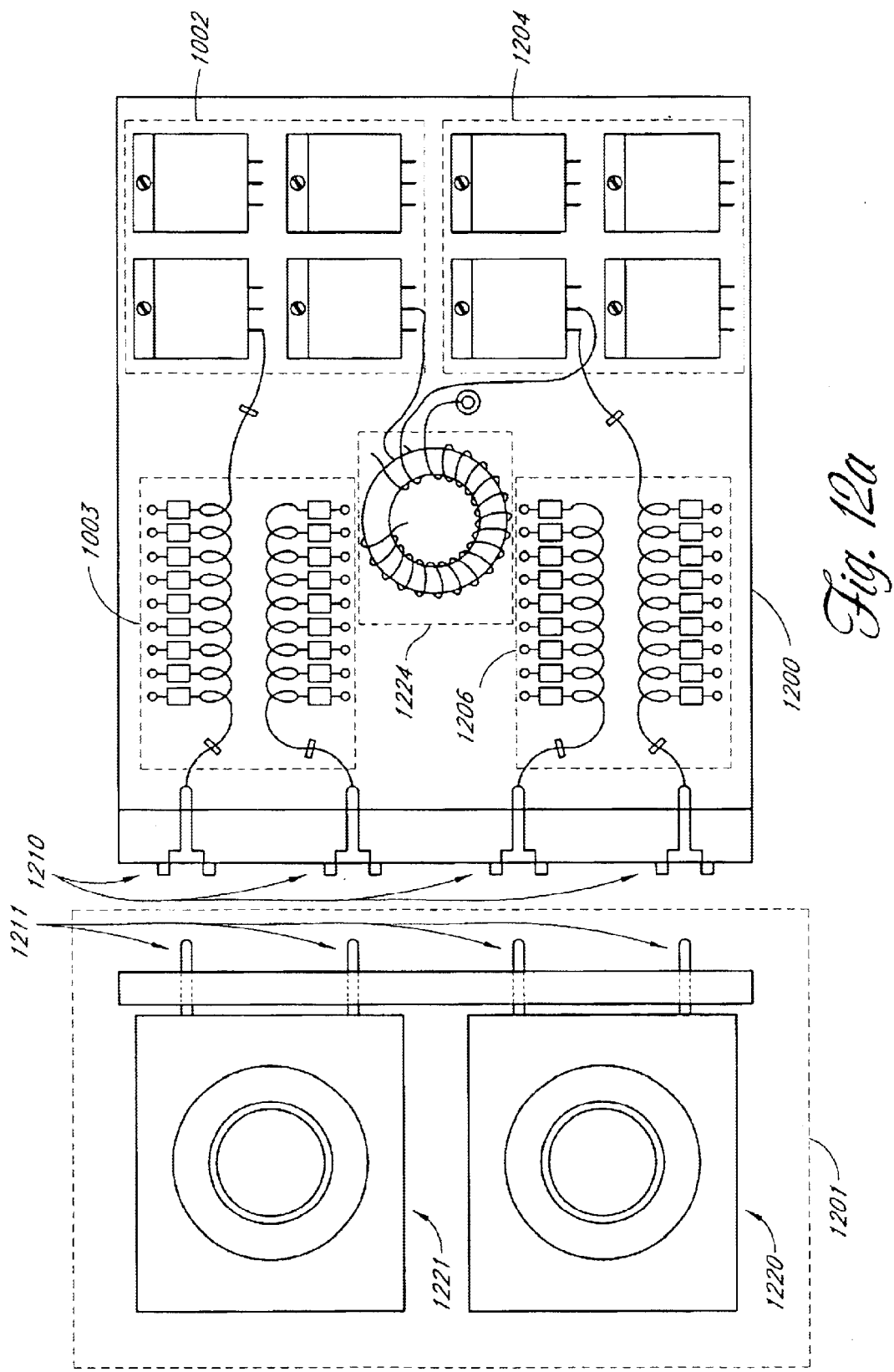
FIG. 12A is a top view showing one embodiment of a layout of a modular two-channel core driver and split core transformer assembly.
Figure 12B:
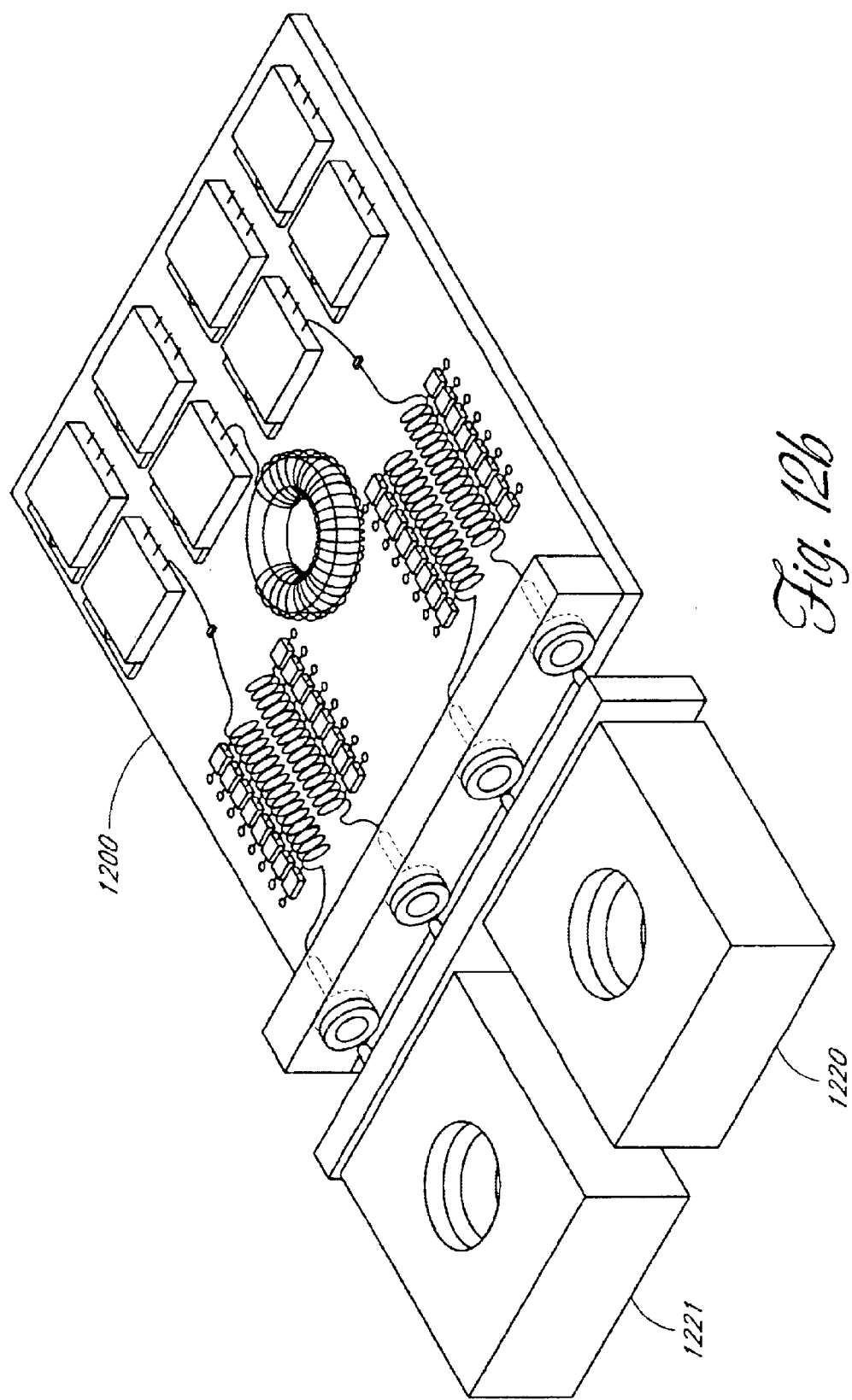
FIG. 12B is a perspective view of the layout shown in FIG. 12A.

FIG. 12A is a top view showing one embodiment of a layout of a modular two-channel core driver 1200 and a two-channel split core transformer assembly 1201. The two-channel split core transformer assembly 1201 includes a first core assembly 1220 and a second core assembly 1221. FIG. 12B is a perspective view of the two-channel core driver 1200 and the two-channel split core transformer assembly 1201. The core driver 1100 shown in FIG. 11 is a single-channel circuit. The modular two-channel core driver 1200 uses two of the core drivers 1100 driven by a common pulse transformer 1224. The pulse transformer 1224 is similar to the transformer 1101 shown in FIG. 11, but with two single-turn secondary windings instead of one. The first secondary winding drives an upper core driver circuit 1100 comprising the driver 1002 and the forming line 1003. The second secondary winding drives a lower core driver circuit 1100 comprising the driver 1204 and the forming line 1206. The upper core driver drives a single-turn primary winding of the core assembly 1221. The lower core driver drives a single-turn primary winding of a core assembly 1220.

The two-channel core driver 1200 and the two-channel split core transformer assembly 1201 are connected by pluggable connectors 1211 and 1210. The use of pluggable connectors allows the two-channel core driver 1200 to be easily unplugged from the split core transformer assembly 1201 for repair and/or replacement.

Figure 13:
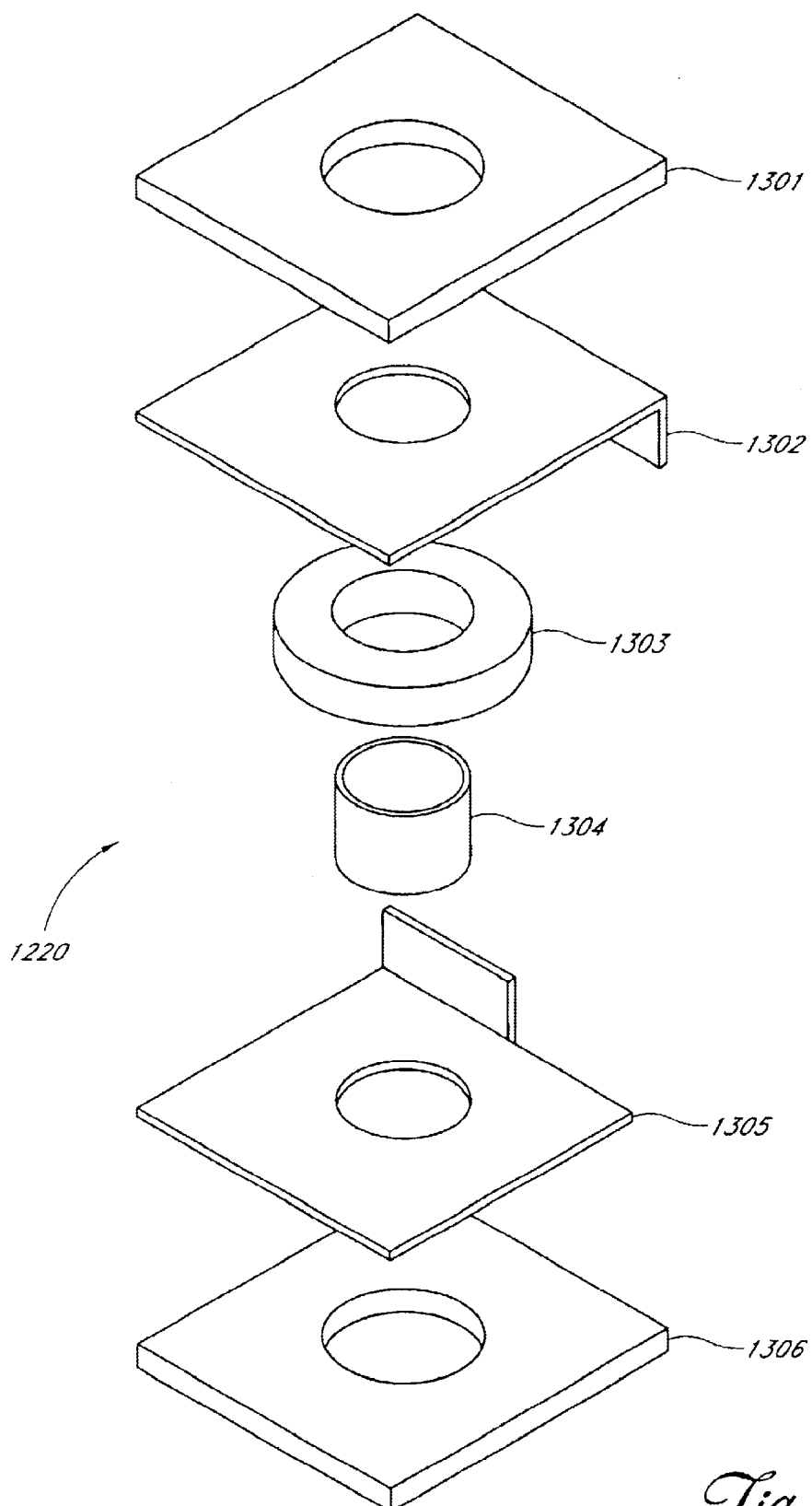
FIG. 13 is an exploded view of the split core transformer assembly.

FIG. 13 is an exploded view of the core assembly 1220 (the split core transformer assembly 1221 is similar). The core assembly 1220 includes an upper support member 1301, an upper conductor 1302, a toroidal ferrite core 1303, a conducting sleeve 1304, a lower conductor 1305, and a lower support member 1306. The conducting sleeve 1304 fits inside the hole of the ferrite core 1304. The upper conductor 1302 is electrically connected to an upper edge of the sleeve 1304, and the lower conductor 1305 is electrically connected to the lower conductor 1305. The together, the upper conductor 1302, the sleeve 1304, and the lower conductor 1305 make a low-impedance single-turn winding around the core 1304. The upper support member 1301 and the lower support member 1306 provide mechanical support for the assembly 1220. Tabs on the front of the upper conductor 1302 and the lower conductor 1305 are provided to plugs to connect the single-turn winding to the driver assembly 1200.

Figure 14:
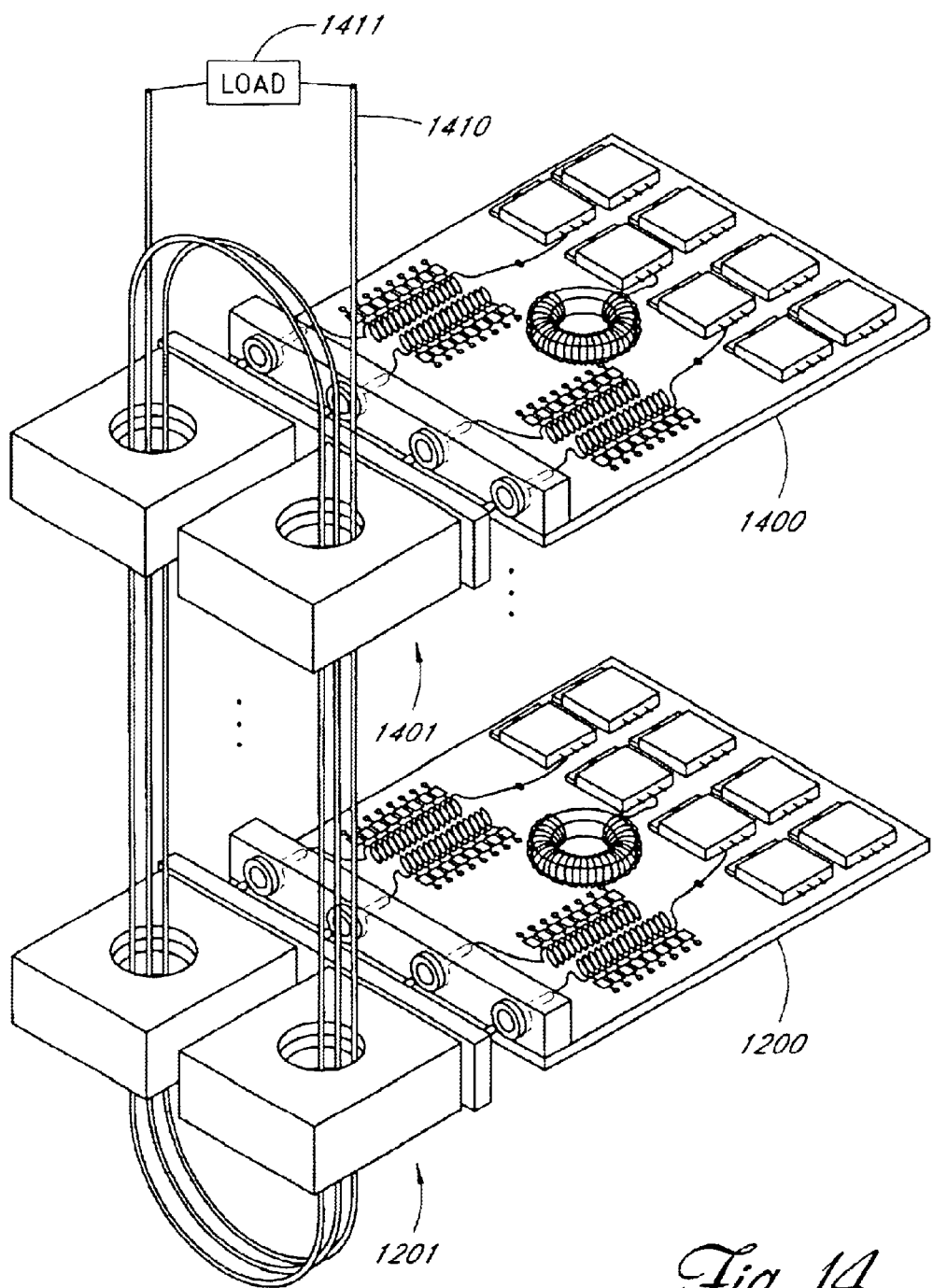
FIG. 14 is a perspective view showing a single secondary winding that couples to multiple two-channel split-core assemblies.

FIG. 14 is a perspective view showing a single secondary winding 1410 that couples to multiple two-channel split-core assemblies 1201 and 1401. Although only two two-channel assemblies are shown, many such assemblies can be stacked and linked by the single secondary winding 1410. The secondary winding 1410 can be a single-turn winding or a multi-turn winding. The winding 1410 drives a load 1411.

Figure 15:
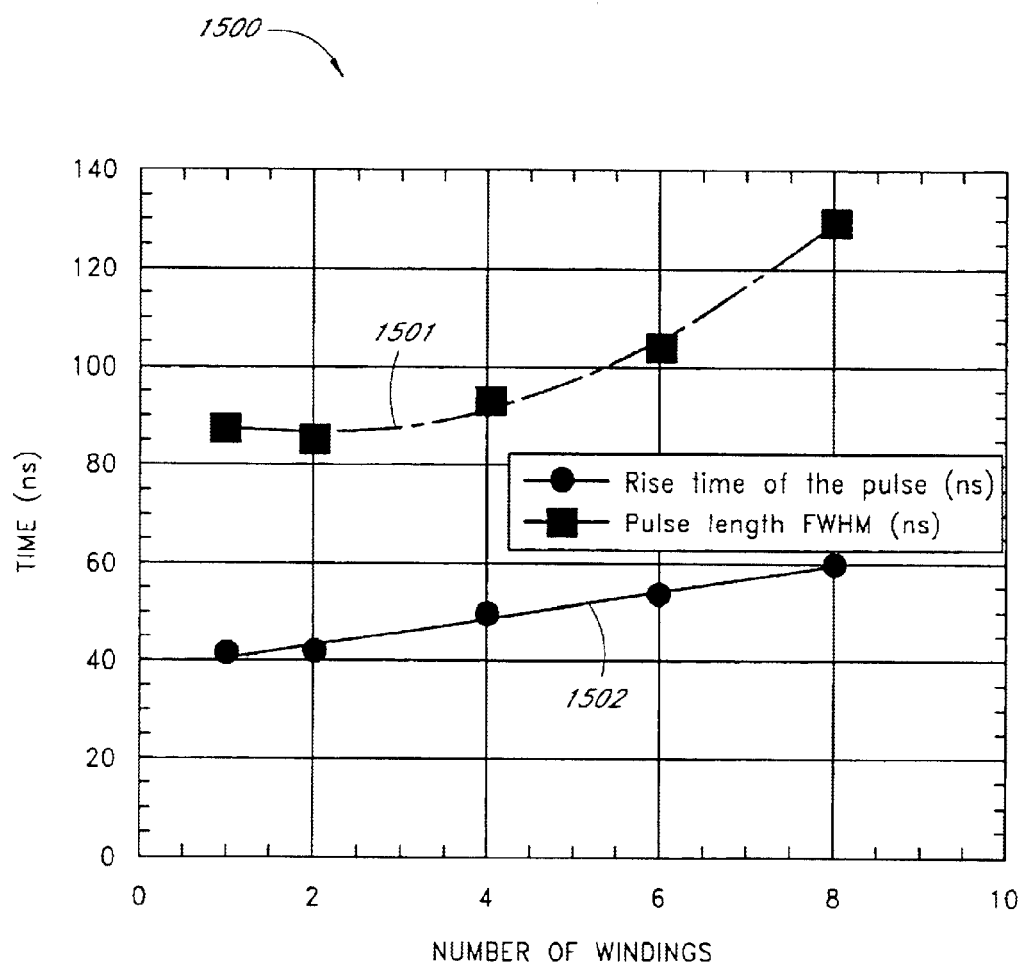
FIG. 15 is a plot showing pulse length and pulse risetime versus the number of turns in the secondary winding of the split core transformer.

FIG. 15 is a plot showing pulse length and pulse rise time versus the number of turns in the secondary winding of the split core transformer. FIG. 15 shows a curve 1501 that indicates rise time of the pulse (in nanoseconds) as a function of the number of turns in the secondary winding. The curve 15 shows that the rise time increases with increasing number of turns. FIG. 15 also shows a curve 1502 that indicates pulse length (in nanoseconds) as a function of the number of turns in the secondary winding. For the embodiment shown, a three-turn secondary produces a pulse risetime of approximately 45 ns and a pulse length of approximately 90 ns.

Figure 16:
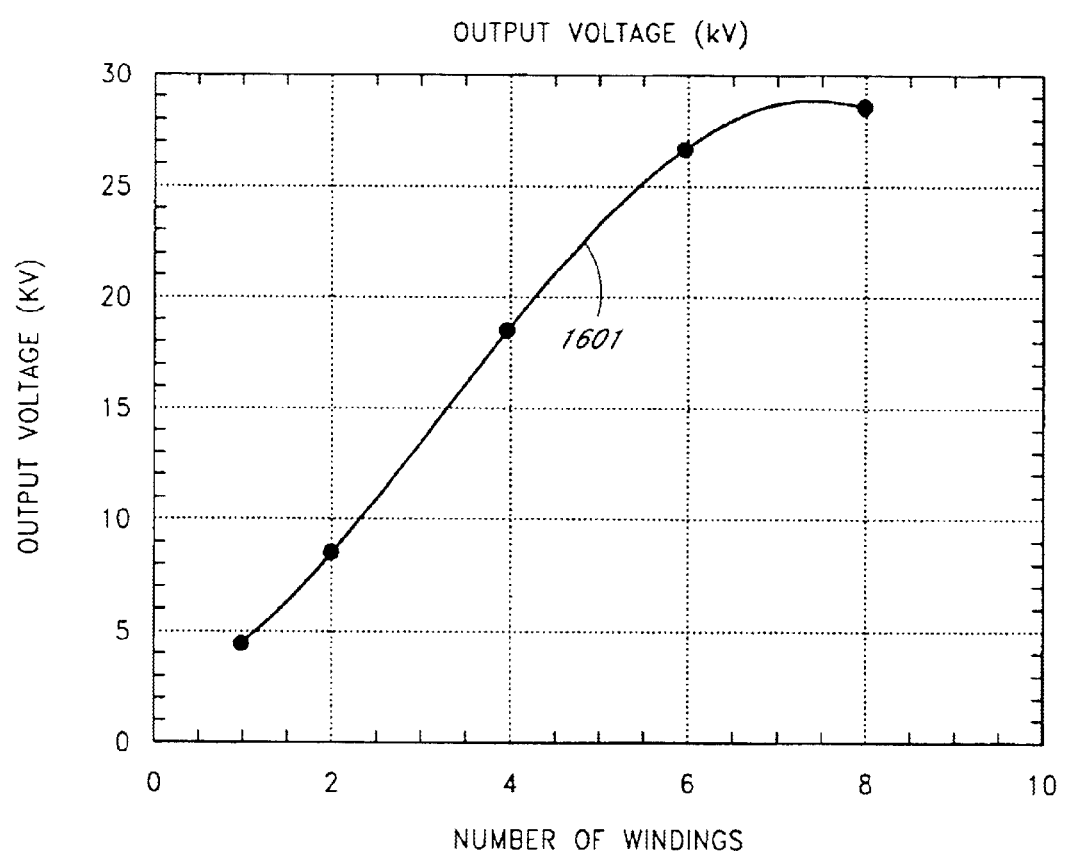
FIG. 16 is a plot showing secondary output voltage versus the number of turns in the secondary winding of the split core transformer.

FIG. 16 is a plot showing a curve 1601 that indicates secondary output voltage as a function of the number of turns in the secondary winding of the split core transformer. The curve 1601 shows that the output voltage increases approximately linearly with the number of turns until about six turns, where the curve 1601 flattens out.

Figure 17:
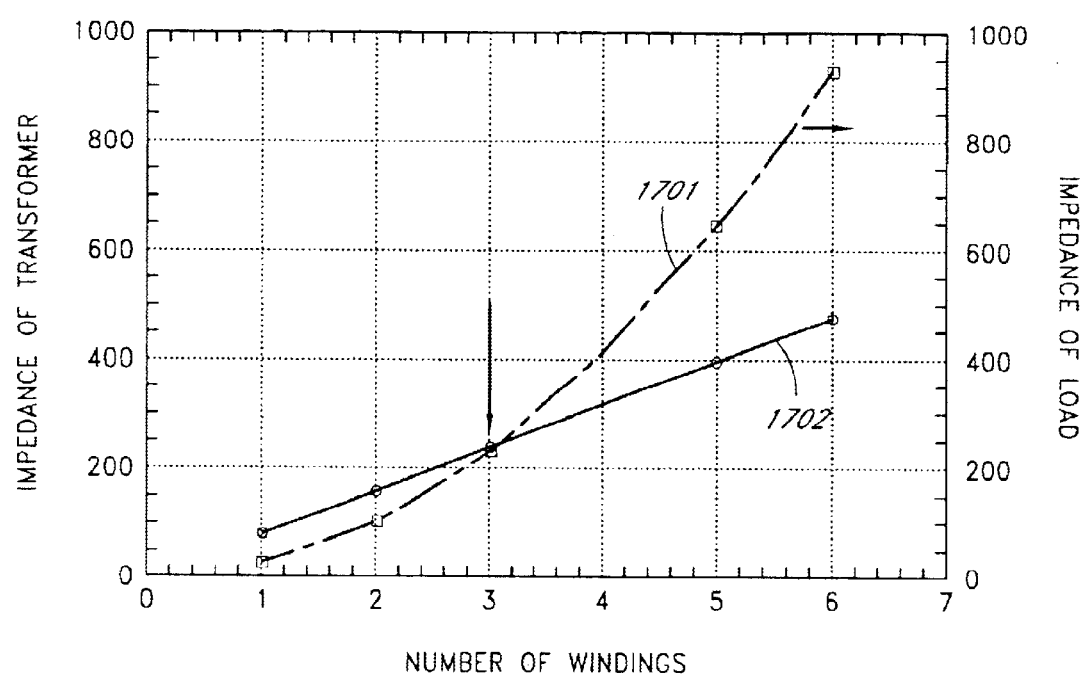
FIG. 17 is a plot showing impedance matching of the split core transformer secondary to a load as a function of the number of turns in the secondary winding of the split core transformer.

FIG. 17 is a plot showing impedance matching of the split core transformer secondary to a load as a function of the number of turns in the secondary winding of the split core transformer. FIG. 17 includes a curve 1701 that shows load impedance as a function of the number of turns. FIG. 17 also includes a curve 1702 that shows transformer output impedance as a function of the number of turns. For the case plotted, the curves 1701 and 1702 intersect at approximately three turns, indicating that the transformer and the load are impedance-matched when the transformer secondary has approximately three turns.

Figure 18:
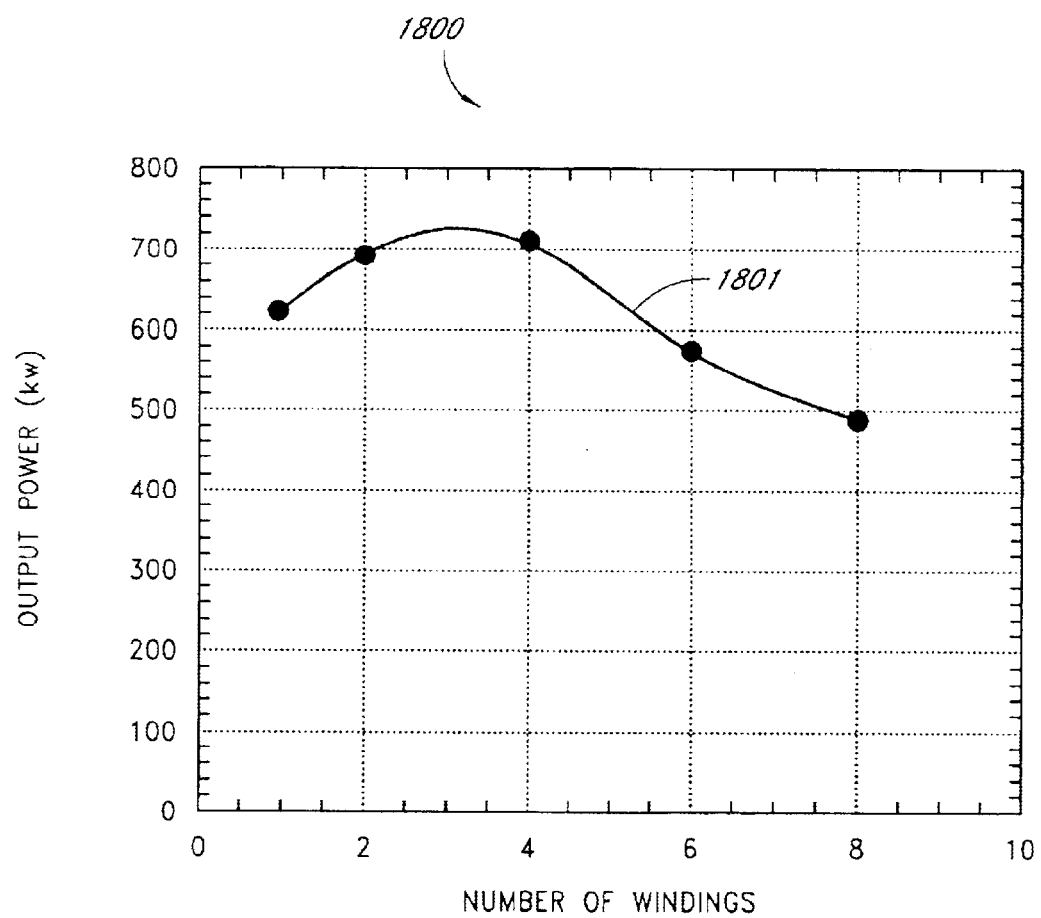
FIG. 18 is a plot showing output power versus the number of turns in the secondary winding of the split core transformer.

FIG. 18 shows a curve 1801 that shows output power as a function of the number of turns in the secondary winding of the split core transformer. For the case plotted, maximum output power occurs when the secondary has approximately three turns (in agreement with the data plotted in FIG. 17).

FIG. 19 is a circuit schematic of an alternate embodiment of a core driver 1900. The core driver 1900 is similar to the core driver 1100 with the following changes. The snubber circuit has been omitted. The second inductor terminal of the lumped-element transmission line 1101 is provided to a first terminal of the primary winding 1137 through the inductor 1113. The second terminal of the winding 1137 is provided to the first inductor terminal of the lumped-element transmission line 1102 (without passing through the inductor 1113).

Although the foregoing has been a description and illustration of specific embodiments of the invention, various modifications and changes can be made thereto by persons skilled in the art, without departing from the scope and spirit of the invention as defined by the following claims.

What is claimed is:

1. A solid-state pulse generator, comprising:
   a plurality of transformer cores, each core including a single-turn primary winding;
   a plurality of core drivers, each of said core drivers configured to produce a primary pulse and provide said primary pulse to at least one of said single-turn primary windings;
   a pulse generator configured to produce a drive pulse for driving the plurality of core drivers, each of said core drivers producing one primary pulse in response to said drive pulse, said drive pulse being longer in time than said primary pulse; and
   an output secondary winding, said output secondary winding linking substantially all of said transformer cores.

2. The solid-state pulse generator of claim 1, wherein each of said core drivers uses at least one blumlein to store energy for said primary pulse.

3. The solid-state pulse generator of claim 2, wherein said blumlein is recharged after an end of said drive pulse.

4. The solid-state pulse generator of claim 2, wherein said blumlein is discharged by a solid-state switching device.

5. The solid-state pulse generator of claim 4, wherein said solid-state switching device comprises a MOSFET.

6. The solid-state pulse generator of claim 5, wherein said drive pulse is provided to a primary winding of a pulse transformer and wherein a gate of said MOSFET is driven by a secondary winding of said pulse transformer.

7. The solid-state pulse generator of claim 1, wherein said output secondary winding is a multi-turn winding.

8. The solid-state pulse generator of claim 1, wherein each of said core drivers comprises:
   a plurality of solid-state switches; and
   first and second lumped-element transmissions lines connected as a blumlein, said first lumped-element transmission lines switched to ground by said plurality of solid-state switches, said second lumped-element transmission line coupled in series with said first lumped-element transmission line and one of said single-turn primary windings.

9. The solid-state pulse generator of claim 8, wherein each of said core drivers further comprises a pulse-sharpening system.

10. The solid-state pulse generator of claim 9, wherein said pulse-sharpening system comprises a saturable-core inductor.

11. The solid-state pulse generator of claim 10, wherein said saturable core inductor comprises a ferrite bead.

12. The solid-state pulse generator of claim 1, further comprising a pulse-sharpening device in series with each of said single-turn primary windings.

13. The solid-state pulse generator of claim 12, wherein said pulse-sharpening device comprises a saturable-core inductor.

14. The solid-state pulse generator of claim 12, wherein said pulse-sharpening device comprises a ferrite bead wrapped around a portion of said single-turn primary winding.

15. A modular solid-state pulse generator and split-core transformer system comprising:
   a first core driver module configured to provide a primary winding drive pulse to one or more first connectors; and
   a first transformer core assembly having a first primary winding provided to a one or more second connectors, said first connectors configured to be removably connectable to said second connectors to allow said core driver module to drive said first primary winding;
   a second transformer core assembly having a second primary winding; and
   a secondary winding that links both said first transformer core and said second transformer core.

16. The modular solid-state pulse generator and split-core transformer system of claim 15, wherein said core driver module comprises a blumlein.

17. The modular solid-state pulse generator and split-core transformer system of claim 15, wherein said first primary winding comprises a single-turn winding.

18. The modular solid-state pulse generator and split-core transformer system of claim 15, wherein said secondary winding comprises a multi-turn winding.

19. The modular solid-state pulse generator and split-core transformer system of claim 15, further comprising a load, said secondary winding configured to deliver power to said load.

20. The modular solid-state pulse generator and split-core transformer system of claim 15, said secondary winding configured to substantially an impedance of said load by adjusting a number of turns in said secondary winding.

21. The modular solid-state pulse generator and split-core transformer system of claim 15, wherein said core driver module comprises a blumlein controlled by a solid-state switch.

22. A pulse generator, comprising:
   a first transformer core having a first primary winding;
   a second transformer core having a second primary winding;
   a core driver which produces a primary pulse and provides said primary pulse to said first primary winding, said core driver comprising a blumlein; and
   a secondary winding that links both said first transformer core and said second transformer core.

23. The pulse generator of claim 22, wherein said blumlein comprises first and second inductors.

24. The pulse generator of claim 23, wherein said first inductor comprises multiple turns with a capacitor provided to each turn.

25. The pulse generator of claim 22, wherein said core driver further comprises a snubber, said snubber comprising a resistor with a resistance substantially equal to an impedance of said blumlein.

26. The pulse generator of claim 22, further comprising a pulse sharpener, said pulse sharpener comprising a saturable core inductor in series with said blumlein.

27. The pulse generator of claim 22, wherein said blumlein is switched by a solid-state switch comprising a MOSFET, said MOSFET having a gate, said gate driven by a pulse transformer, said pulse transformer driven by a pulse generator, said pulse generator driven by a master trigger.

28. A pulse generator system comprising:
a first magnetic core having a first primary winding;
a second magnetic core having a second primary winding;
a secondary winding wound through at least said first magnetic core and said second magnetic core;
a first core driver which drives said first primary winding with a first drive pulse in response to a trigger pulse;
a second core driver which drives said second primary winding with a second drive pulse in response to said trigger pulse; and
a trigger-pulse generator for generating said trigger pulse, said trigger pulse being longer in time than said drive pulse.

29. The pulse generator system of claim 28, further comprising:
a master trigger generator which generates a master trigger pulse, said master trigger pulse provided to said trigger-pulse generator, said trigger-pulse generator generating said trigger-pulse in response to said master trigger pulse.

30. The pulse generator system of claim 28, wherein said first core driver comprises a first blumlein for generating said first drive pulse.

31. The pulse generator system claim 30, wherein said trigger-pulse generator comprises:
a solid state switch; and
a second blumlein, said second blumlein configured to generate a pulse at least twice a long in duration as a pulse generated by said first blumlein.

32. The solid state pulse generator of claim 28, said first magnetic core comprising a toroidal core.

33. The solid state pulse generator of claim 28, said first primary winding comprising a single-turn winding.

34. The solid state pulse generator of claim 28, wherein said first core driver comprises a pulse transformer which comprises:
a toroidal core;
a three-conductor transmission line, said three-conductor transmission line comprising a first conductive layer, a second conductive layer, and a third conductive layer;
a first one-turn secondary winding wound on said toroidal core, a first terminal of said first one-turn secondary winding provided to said first conductive layer and a second terminal of said first one-turn secondary winding provided to said second conductive layer;
a second one-turn secondary winding wound on said toroidal core, a first terminal of said second one-turn secondary winding provided to said first conductive layer and a second terminal of said second one-turn secondary winding provided to said second conductive layer;
a third one-turn secondary winding wound on said toroidal core, a first terminal of said third one-turn secondary winding provided to said second conductive layer and a second terminal of said third one-turn secondary winding provided to said third conductive layer;
a fourth one-turn secondary winding wound on said toroidal core, a first terminal of said fourth one-turn secondary winding provided to said second conductive layer and a second terminal of said fourth one-turn secondary winding provided to said third conductive layer; and
a plurality of primary windings wound on said toroidal core.

35. A split-core transformer comprising:
a plurality of transformer cores each core having a separate primary winding, each of said separate primary windings linking only one of said transformer cores; and
a secondary winding, said secondary winding linking all of transformer cores, said transformer cores arranged in two columns of cores such that a shape of said secondary winding approximates an oval racetrack.

36. A split-core transformer comprising:
a plurality of transformer cores each core having a separate primary winding, each of said separate primary windings linking only one of said transformer cores; and
a secondary winding, said secondary winding linking two or more of said transformer cores, said transformer cores arranged in circular fashion such that a shape of said secondary winding approximates a circle.

37. A split-core transformer comprising:
a plurality of toroidal magnetic cores each core having a separate primary winding, each of said separate primary windings linking only one of said toroidal magnetic cores; and
a multi-turn secondary winding, said secondary winding linking all of toroidal magnetic cores, said secondary winding linking each of said toroidal magnetic cores once per turn.

38. A pulse generator apparatus, comprising:
a first magnetic core having a first primary winding;
a second magnetic core having a second primary winding;
means for generating a first pulse in said first primary winding in response to a drive pulse where a pulse length of said first pulse can be longer than a pulse length of said drive pulse;
means for generating a second pulse in said second primary winding in response to said drive pulse where a pulse length of said second pulse can be longer than a pulse length of said drive pulse and where said first pulse and said second pulse have substantially the same pulse length; and
an output secondary winding, said output secondary winding linking said first magnetic core and said second magnetic core.

* * * * *